(12) United States Patent
Blanton et al.

(10) Patent No.: US 8,509,517 B2
(45) Date of Patent: Aug. 13, 2013

(54) METHOD AND SYSTEM FOR SYSTEMATIC DEFECT IDENTIFICATION

(75) Inventors: Ronald DeShawn Blanton, Sewickley, PA (US); Wing Chiu Tam, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 154 days.

(21) Appl. No.: 12/980,703

(22) Filed: Dec. 29, 2010

(65) Prior Publication Data

US 2012/0170830 A1 Jul. 5, 2012

(51) Int. Cl.
*G06K 9/00* (2006.01)
*G06K 9/46* (2006.01)

(52) U.S. Cl.
USPC .......................... 382/149; 382/100; 382/190

(58) Field of Classification Search
USPC ................ 382/149, 128, 103, 100, 232, 190, 382/154, 199, 132; 707/705, 709, 710, 706, 707/769, 999.006, E17.008, 999.107, E17.108; 715/862, 769, 719; 367/131; 348/E5.096
See application file for complete search history.

(56) References Cited

U.S. PATENT DOCUMENTS

| | | | |
|---|---|---|---|
| 7,174,414 B2 * | 2/2007 | Nguyen et al. ..................... 711/4 |
| 7,190,822 B2 * | 3/2007 | Desplats et al. ............... 382/145 |
| 7,570,796 B2 * | 8/2009 | Zafar et al. ..................... 382/144 |
| 7,752,581 B2 * | 7/2010 | Lanzerotti et al. .............. 716/52 |
| 7,770,080 B2 | 8/2010 | Blanton et al. |
| 7,991,497 B2 * | 8/2011 | Lin et al. ........................ 700/108 |
| 8,139,844 B2 * | 3/2012 | Chen et al. ..................... 382/145 |

OTHER PUBLICATIONS

Crockett, H. et al., " Using Design Based Binning to Improve Defect Excursion Control for 45nm Production," ISSM Paper: DM-P-240, IEEE, Oct. 5-17, 2007, 3 pages.
Crockett, H. et al., "Using Design Based Binning to Improve Defect Excursion Control for 45nm Production," Yield Management Solutions, Vol. 1, Summer 2008, 4 pages.
Desineni, R. "A Logic Diagnosis Methodology for Improved Localization and Extraction of Accurate Defect Behavior," International Test Conference, Oct. 2006, pp. 1-10.
Ghan, J. et al., "Clustering and Pattern Matching for an Automatic Hotspot Classification and Detection System," Proc. SPIE, vol. 7275, Mar. 2009, pp. 727516-11.
Jansen, S. et al., "Utilizing Design Layout Information to Improve Efficiency of SEM Defect Review Sampling," Advanced Semiconductor Manufacturing conference, May 2008, pp. 69-71.
Ma, N. et al., "Automatic Hotspot Classification Using Pattern-Based Clustering," Proc. SPIE, vol. 6925, Apr. 2008, pp. 692505-10.
Tam, W. et al., "Precise Failure Localization Using Automated Layout Analysis of Diagnosis Candidates," Design Automation Conference, Jun. 2008, pp. 367-372.

(Continued)

*Primary Examiner* — Sheela Chawan
(74) *Attorney, Agent, or Firm* — Withrow & Terranova, P.L.L.C.

(57) ABSTRACT

A method and apparatus for identifying suspect layout features from a plurality of layout features of an integrated circuit (IC) layout. A plurality of snippet images is generated, each of which depicts at least a portion of a suspect layout feature which is different from suspect layout features depicted in others of the plurality of snippet images. The suspect layout features are determined based on the diagnosis of a plurality of defective ICs manufactured in accordance with the IC layout. A plurality of clusters is generated, and each of the clusters contains a group of the plurality of snippet images based on similarities between the snippet images.

20 Claims, 11 Drawing Sheets

(56) References Cited

OTHER PUBLICATIONS

Kruseman, B. et al., "Systematic Defects in Deep Sub-Micron Technologies," International Test Conference, Oct. 26-28, 2004, pp. 290-299.

Koenemann, B., "Design/Process Learning from Electrical Test," International Conference on Computer Aided Design, Nov. 7-11, 2004, pp. 733-738.

Pomeranz I. et al., "On Clustering of Undetectable Single Stuck-At Faults and Test Quality in Full-Scan Circuits,", IEEE Transactions on Cimputer Aided Design of Integrated Circuits and Systems, vol. 29, Jul. 2004, pp. 1135-1140.

Nelson, J. et al., "Diagnosis-Enhanced Extraction of Defect Density and Size Distributions from Digital Logic Ics," SRC Techon, Oct. 2007, 4 pages.

Yu, X. et al., "Controlling DPPM through Volume Diagnosis," VLSI Test Symposium, May 2-7, 2009, pp. 134-139.

Tang, H. et al., "Analyzing Volume Diagnosis Results with Statistical Learning for Yield Improvement," 12th IEEE European Test Symposium, May 20-24, 2007, 6 pages.

Keim, M. et al., "A Rapid Yield Learning Flow Based on Production Integrated Layout-Aware Diagnosis," International Test Conference, Oct. 2006, pp. 1-10.

Sharma, M. et al., "Efficiently Performing Yield Enhancements by Identifying Dominant Physical Root Cause from Test Fail Data," International Test Conference, Oct. 28-30, 2008, pp. 1-9.

Jahangiri, J. et al., "Value-Added Defect Testing Techniques," IEEE Design & Test of Computers, vol. 22, May-Jun. 2005, pp. 224-231.

Turakhia, R. et al., "Bridging DFM Analysis and Volume Diagnostics for Yield Learning—A Case Study," VLSI Test Symposium, May 3, 2009, pp. 167-172.

Maly, W. et al., "Yield Estimation Model for VLSI Artwork Evaluation," Electronic Letters, vol. 19, Mar. 17, 1983, pp. 226-227.

Huisman, L.M. et al., "Data Mining Integrated Circuit Fails with Fail Commonalities," International Test Conference, Oct. 26-28, 2004, pp. 661-668.

Tam, W. et al., "Evaluating Yield and Testing Impact of Sub-Wavelength Lithography," VLSI Test Symposium, Apr. 19-22, 2010, pp. 200-205.

MacQueen, J.B., "Some Methods for Classification and Analysis of Multivariate Observations," Berkley Symposium on Math, Statistics, and Probability, Jun. 21-Jul. 18, 1965 and Dec. 27-Jan. 7, 1966, pp. 281-297.

"SICAT 6.0 Documentation," 6.0 edition, San Jose, CA, PDF Solutions Inc., 2001, Accessed Jan. 3, 2012, 510 pages.

Bartenstein, T. et al., "Diagnosing Combinational Logic Designs Using the Single Location At-a-Time (SLAT) Paradigm," International Test Conference, Oct. 30-Nov. 1, 2001, pp. 287-296.

Lavo, D.B. et al., "Multiplets, Models, and the Search for Meaning: Improving Per-Test Fault Diagnosis," International Test Conference, Dec. 2002, pp. 250-259.

Venkataraman, S. et al., "POIROT: A Logic Fault Diagnosis Tool and its Applications," International Test Conference, Oct. 3-5, 2000 pp. 253-262.

Millman, S.D. et al., "Diagnosing CMOS Bridging Faults with Stuck-at Fault Dictionaries," International Test Conference, Sep. 10-14, 1990, pp. 860-870.

Sato, Y. et al., "A Persistent Diagnostic Technique for Unstable Defects," International Test Conference, Dec. 2002, pp. 242-249.

Kubiak, K. et al., "Exact Evaluation of Diagnostic Test Resolution," Design Automation Conference, Jun. 8-12, 1992, pp. 347-352.

SI2, "Si2 Mission," Accessed Jan. 5, 2012, 2 pages, www.si2.org/openeda.si2.org.

"Computational Geometry Algorithms Library," Accessed Nov. 29, 2011, 2 pages, www.cgal.org.

Cairo, "CAIRO," Accessed Nov. 29, 2011, 1 page, www.cairographics.org.

Rubin, S., "Appendix C: GDSII Format," in Computer Aids for VLSI Design, 1994, Accessed Jan. 4, 2012, 6 pages.

Aichholzer, O. et al., "A Novel Type of Skeleton for Polygons," Journal of Universal Computer Science, vol. 1, Dec. 1995, pp. 752-761.

Bishop, C.M. et al., Pattern Recognition and Machine Learning, 1st edition, Springer-Verlag, New York, Inc., Oct. 2007, pp. 403-410.

Jain, A.K. et al., "Data Clustering: A Review," ACM Computing Surveys, vol. 31, Sep. 1999, pp. 264-323.

Mekkoth, J. et al., "Yield Learning with Layout-Aware Advanced Scan Diagnosis," International Symposium for Testing and Failure Analysis, Nov. 2006, pp. 412-418.

Fabbri, R. et al., "2D Euclidean Distance Transform Algorithms: A Comparative Survey," ACM Computing Surveys, vol. 40, Feb. 2008, pp. 1-44.

Dhillon, I.S. et al., "Concept Decompositions for Large Sparse Text Data Using Clustering," Machine Learning Journal, vol. 42, Jan.-Feb. 2001, 31 pages.

Mahalanobis, P.C., "On the Generalized Distance Statistics," Proceedings of the National Institute of Science India, Apr. 15, 1936, pp. 49-55.

Bishop, C.M., "Mixture Models and the EM Algorithm," Advanced Tutorial Lecture Series CUED, 2006, 69 pages.

Shi, J. et al., "Normalized Cuts and Image Segmentation," IEEE Transactions on Pattern Analysis and Machine Intelligence, vol. 22, Aug. 2000, pp. 888-905.

Ng, A. et al., "On Spectral Clustering: Analysis and an Algorithm," Neural Information Processing Systems, 14, 2001, 8 pages.

Mahajan, M. et al., "The Planar k-Means Problem is NP-Hard," International Workshop on Algorithms and Computation, Feb. 2009, 15 pages.

"The MATLAB Help Manual," R2011b edition, Natick, MA, The MathWorks, Inc., Sep. 2011, 276 pages.

"The Calibre CMPAnalyzer User Manual," 2010.3 edition, Wilsonville, OR: Mentor Graphics Corporation, 2010, 93 pages.

Jhaveri, T. et al., "Enabling Technology Scaling with 'In Production' Lithography Processes," Mar. 2008, 10 pages.

Tam, W.C. et al., "Automatic DFM Rule Discovery through Layout Snippet Clustering," International Workshop on Design for Manufacturability and Yield, Jun. 2010, 4 pages.

Dai, V. et al., "DRC Plus: Augmenting Standard DRC with Pattern Matching on 2D Geometrics," Proc. SPIE, vol. 6521, Mar. 15, 2007, pp. 65210A-12.

Tam, W.C. et al., "Automated Failure Population Creation for Validating Integrated Circuit Diagnosis Methods," Design Automation Conference, Jul. 26-31, 2009, pp. 708-713.

* cited by examiner

METHOD AND SYSTEM FOR SYSTEMATIC DEFECT IDENTIFICATION

RELATED APPLICATION

This application claims the benefit of provisional patent application Ser. No. 61/397,605, filed Jun. 14, 2010.

FIELD OF THE DISCLOSURE

Embodiments disclosed herein relate to diagnosing integrated circuits (ICs), and in particular to identifying layout features of ICs that cause systematic or systemic defects.

BACKGROUND

Component density in integrated circuits (ICs) has increased the complexity of IC layouts, and increased the likelihood of particular IC layout features causing systematic defects in ICs. However, it is not always obvious which particular IC layout features are more likely to result in systematic defects than other IC layout features.

There are various approaches used today to determine IC layout features that may potentially cause systematic defects, such as searching the IC layout for hotspots. However, not all hotspots result in systematic defects, and not all hotspots in an IC layout can, or should, be avoided. Consequently, hotspot detection done in isolation from actual defective ICs may result in spending time and effort "correcting" an IC layout feature that would not actually be likely to cause a systematic defect.

Another approach to diagnosing a defective IC involves physical failure analysis (PFA) of actual defective ICs to determine the causes of defects on an IC-by-IC basis, but in isolation it can be difficult or impossible to determine if a particular IC layout feature is systemically problematic, due to the low throughput of the PFA process and/or its inability to sometimes identify the defect.

Accordingly, there is a need for improved methods and systems for identifying IC layout features that result in systematic defects in an IC.

SUMMARY

Embodiments disclosed herein relate to identifying suspect integrated circuit (IC) layout features which may result in systematic defects. In one embodiment, a plurality of defective ICs manufactured in accordance with an IC layout is analyzed, and suspect nets within the IC layout are identified. Suspect regions that include the suspect nets are extracted from the IC layout. A plurality of snippet images is created based on the suspect nets in a suspect region. Many snippet images may be generated for each suspect region. Each snippet image depicts at least a portion of a suspect layout feature of the corresponding suspect region. The snippet images are clustered into a plurality of clusters based on similarities between the snippet images. Snippet images closest to the center of one or more clusters are selected for further analysis. Selected snippet images may, for example, undergo lithography simulation to determine if such snippet images depict layout features that result in hotspots. Alternately, chemical-mechanical polishing (CMP) simulation may be performed on the selected snippet images, or physical failure analysis (PFA) may be performed on the ICs that correspond to the selected snippet images, for example.

In one embodiment, a suspect layout region may include one or more suspect nets. Snippet scale and dimension characteristics are determined. Suspect polygons that make up a suspect net are identified. Snippet images containing the suspect polygons are generated. Snippet images are preferably in an image format, such as PDF, PNG, or SVG, for example. The snippet images may contain one or more suspect polygons, as well as neighboring polygons that are not suspect. If a suspect polygon has a dimension, such as a length, which exceeds a snippet dimension such that the entire suspect polygon will not fit within a snippet image, the suspect polygon may be segmented into polygon segments. A snippet image is generated for each polygon segment. Preferably, suspect polygons are positioned within a snippet image with respect to a particular reference point of the snippet image, such as a center of the snippet image.

The snippet images are clustered or otherwise grouped into clusters based on similarities between the snippet images. Representative snippet images from one or more clusters may be selected. Preferably, the representative snippet images closest to a center of a cluster are selected. The representative snippet images then undergo an analysis to determine if layout features depicted in the representative clusters can cause systematic defects.

In one embodiment, a K-means clustering algorithm is used. Because the layout features in a suspect net may result in snippet images that are substantially identical to one another, a first K-means clustering pass of the snippet images from all suspect nets stemming from a diagnosed IC may be performed. Representative snippet images from each cluster are then selected. The selected representative snippet images from the various diagnosed ICs are then clustered as a group in a second pass. Such a two-pass clustering process may eliminate similar or identical snippet images from the same suspect net that may otherwise skew the results of the clustering process.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

An integrated circuit (IC) layout defines the layout features of an IC made in accordance with the IC layout. An IC layout typically defines multiple layers of layout features, including multiple conductive and semi-conductive layers, and interconnections between such layers. Components, interconnections, and other layout features defined in an IC layout are densely packed in an effort to minimize the size of the corresponding IC. Densely packing such layout features can result in systematic defects in an IC that are not necessarily detectable during the IC-layout generation process. As will be discussed in detail herein, embodiments herein rely on the diagnosis of actual failed ICs as a starting point to the identification of IC layout features that may cause systematic defects.

Figure 1:
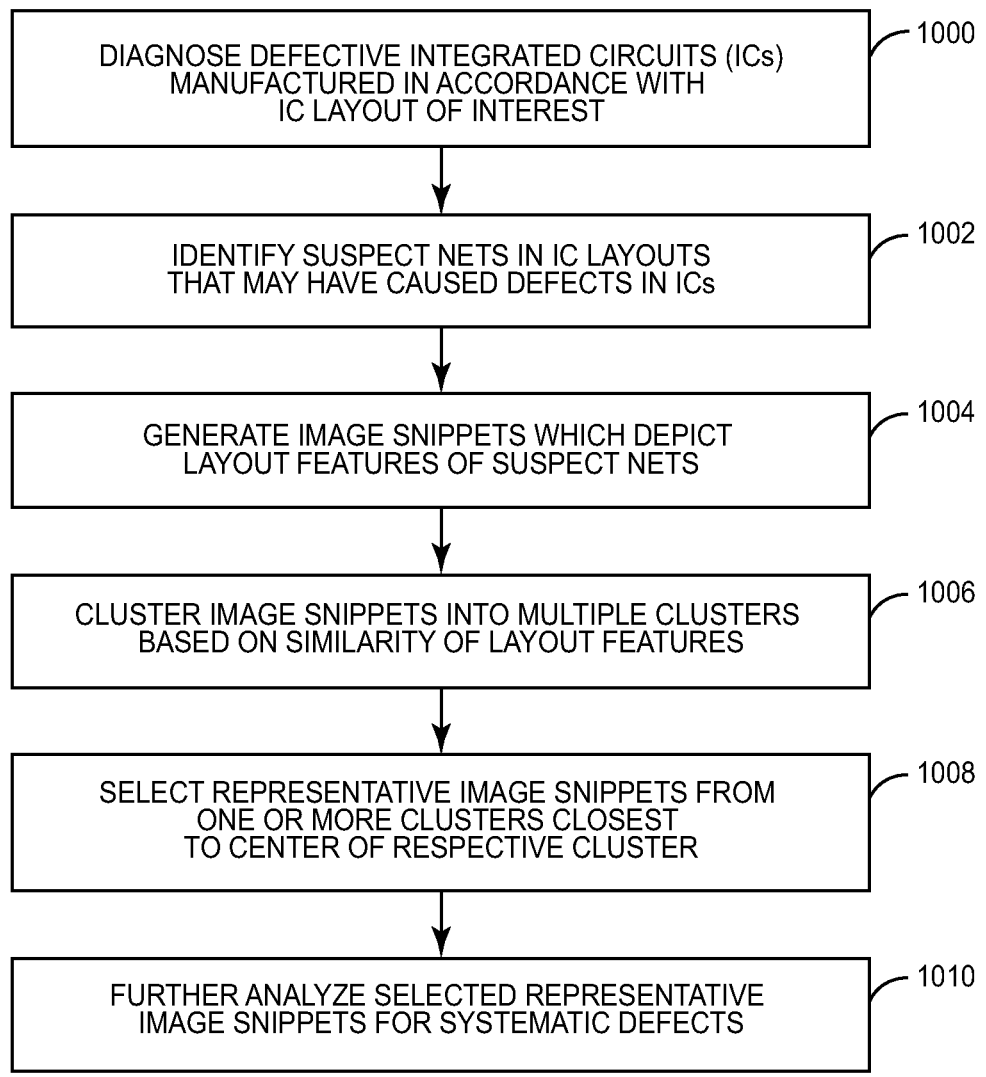
FIG. 1 is a high-level flowchart of an exemplary process for identifying systematic defects caused by layout features according to one embodiment.

FIG. 1 is a high-level flowchart of an exemplary process for identifying systematic defects caused by layout features according to one embodiment. Initially, a volume of defective ICs manufactured in accordance with the IC layout of interest is diagnosed (step 1000). Based on the diagnosis, one or more suspect nets are identified in the IC layout (step 1002). Snippet images of fixed scale and dimensions are generated from the suspect nets that depict layout features of the suspect nets (step 1004). The snippet images are clustered into a plurality of different clusters (step 1006). Representative snippet images are selected from one or more of the clusters (step 1008). The representative snippet images undergo additional analysis to determine if the layout features depicted in the snippet images may result in a systematic defect (step 1010). The present embodiments enable the isolation and identification of IC layout features driven by the diagnosis of actual defective ICs, and thus eliminate the need to analyze the majority of layout features in an IC layout which are not likely to result in a systematic defect.

Figure 2:
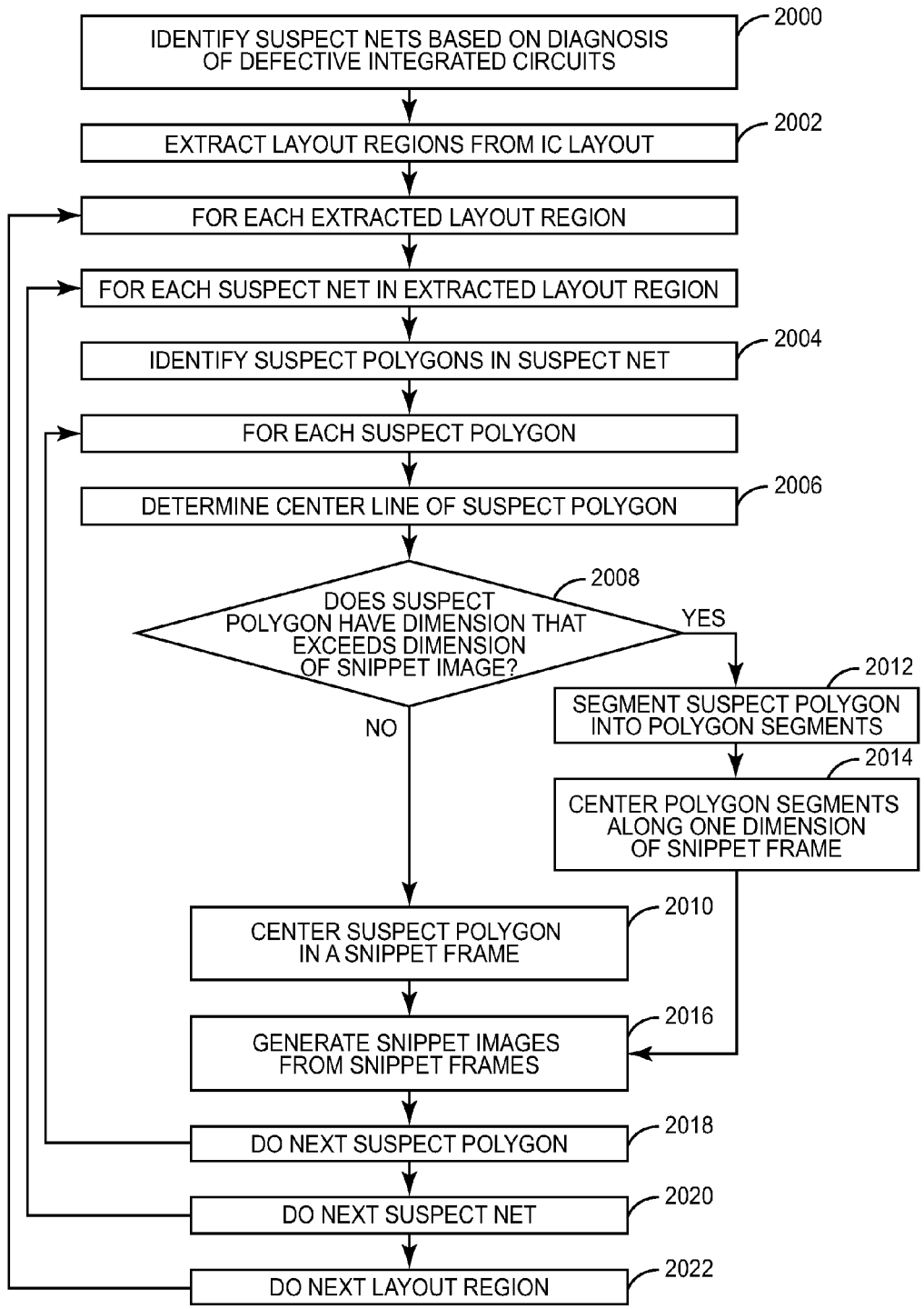
FIG. 2 is a flowchart illustrating steps 1000-1004 of FIG. 1 in greater detail.

FIG. 2 is a more detailed flowchart than FIG. 1 and explains exemplary steps 1000-1004 of FIG. 1 in greater detail. Initially, a volume of ICs manufactured in accordance with the IC layout of interest which have been determined to be defective are diagnosed. The diagnosis of such ICs results in the identification of a plurality of suspect nets which may be the cause of one or more defects in the corresponding IC (step 2000). Multiple suspect nets may be identified from each respective IC. The diagnosis may be performed either manually or automatically. In one embodiment, the diagnosis is performed by a DIAGNOSIX methodology described by R. Desineni et al. in "A Logic Diagnosis Methodology for Improved Localization and Extraction of Accurate Defect Behavior," *International Test Conference*, pp. 1-10, 2006, which is hereby incorporated herein by reference in its entirety. Automated IC diagnostic software is available from a number of sources, including, for example, Testworks, Inc., Pittsburgh, Pa. However, the embodiments herein may be used with any suitable IC diagnostic software.

An IC layout is typically created through the use of a layout tool. The layout tool saves the IC layout in a particular file format, such as the Graphic Data System (GDS) format. Different layout tools use different formats. While the embodiments disclosed herein may use any particular IC layout format, there may be advantages to having the IC layout features of an IC layout defined in a database format to enable efficient and relatively quick access to IC layout features that are offered by a database management package. Accordingly, in one embodiment, there is a one-time conversion of the IC layout of interest into a database. If such a one-time conversion is deemed desirable, the embodiments herein may be used in conjunction with any suitable database software. One potential conversion from an IC layout format to a database format will be described herein in the context of the OpenAccess (OA) database and related software available from the OpenAccess Coalition. It will be assumed that the IC layout of interest is in a GDS format.

The OA database software includes a GDS-to-OA translator which may be used to convert the IC layout from a GDS format to an OA format. If the IC layout is in a format other than the GDS format, and/or a database other than the OA database is used, a suitable translation tool may be developed. The IC layout of interest is provided to the GDS-to-OA translator and loaded into the OA database. Because the GDS format typically provides only geometric information, the OA database is processed to include logical connectivity information between layout features, as well as net and cell identifiers.

Figure 3:
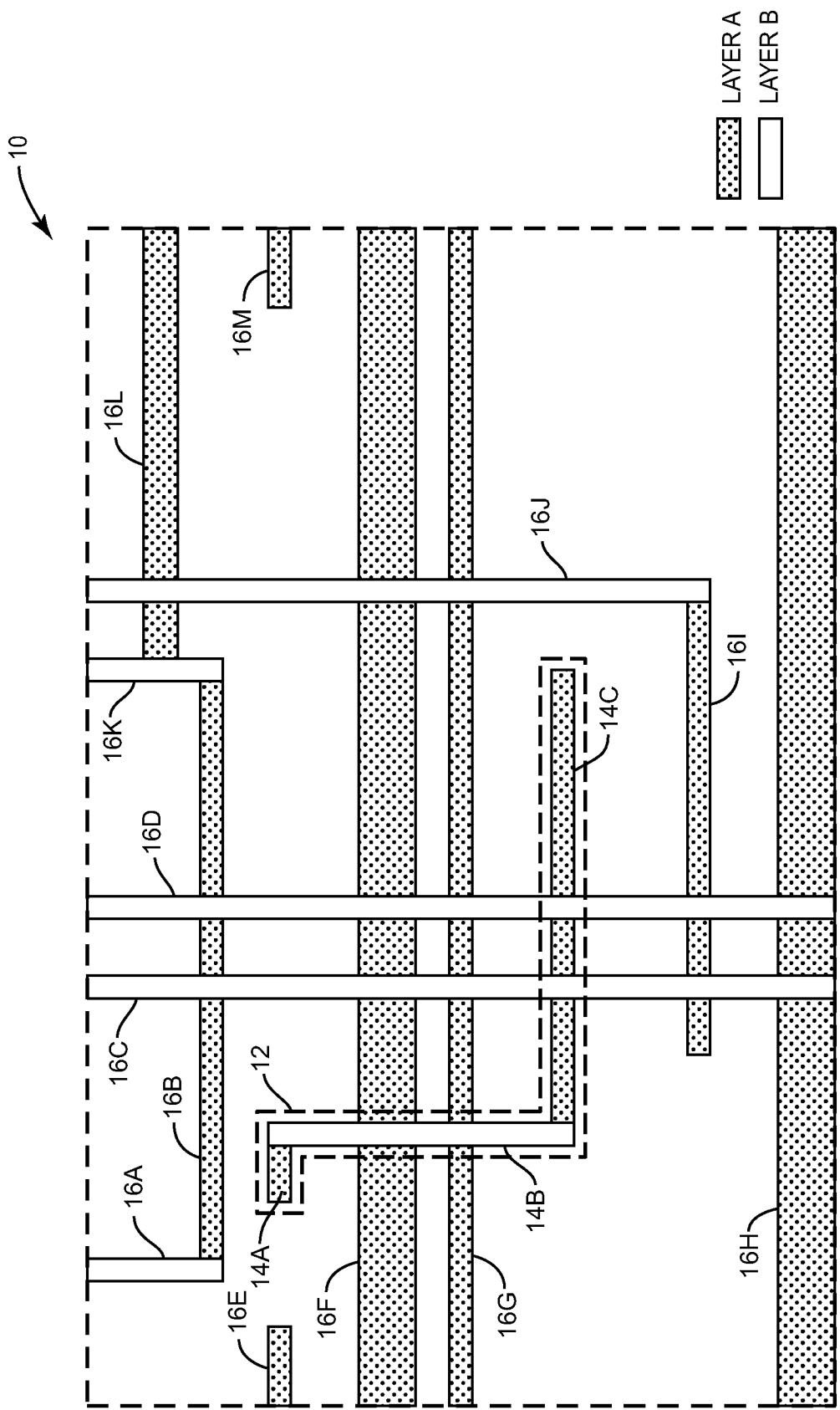
FIG. 3 is a block diagram of an exemplary layout region which contains a suspect net according to one embodiment.

In one embodiment, based on the suspect nets identified during the diagnosis of the defective ICs, layout regions which include the suspect nets are extracted from the OA database (step 2002). The layout regions may be defined, for example, by the IC diagnosis tool by net name, or via any other suitable identifier. The layout regions may be automatically extracted from the OA database with the aid of a layout tool which uses the OpenAccess Library to access the OA database. The OpenAccess Library is also available from the OpenAccess Coalition discussed above. FIG. 3 is a block diagram of an exemplary layout region 10 extracted from the OA database and which contains an exemplary suspect net 12 according to one embodiment. FIG. 3 will be discussed in conjunction with FIG. 2. The layout region 10 includes the exemplary suspect net 12 (identified via a dashed box for purposes of illustration), as well as neighboring nets. While for purposes of illustration the layout region 10 includes only a single suspect net 12, other layout regions 10 may include multiple suspect nets 12. Moreover, the diagnosis of a single IC may identify many suspect nets 12, and consequently each IC diagnosis may result in the extraction of many layout regions 10.

The suspect net 12 includes one or more polygons 14, referred to herein as suspect polygons 14A-14C (generally, suspect polygons 14) to distinguish, for the purposes of illustration, the suspect polygons 14 from other polygons that are located near the suspect polygons 14 (FIG. 2, step 2004). Such nearby polygons are referred to herein as neighboring polygons 16A-16M (generally, neighboring polygons 16) and may not be associated with a suspect net, or may be associated with a different suspect net than the suspect net 12. The polygons, such as the suspect polygons 14 and the neighboring polygons 16, individually or in combination with other polygons, represent IC layout features, such as the actual form and structure of an interconnect between two cells implemented in an IC manufactured in accordance with the IC layout of interest.

Snippet characteristics which define the scale and dimensions of snippet images are determined. The use of a fixed snippet scale and dimensions, as discussed in greater detail herein, enables a clustering algorithm to cluster snippet images based on similarities between layout features depicted in the snippet images. Preferably, a snippet scale and dimensions are chosen such that a snippet image contains a suspect polygon 14, or a segment of a suspect polygon 14, as well as some neighboring polygons 16 or segments of neighboring polygons 16. Also preferably, the snippet scale and dimensions are chosen to capture all interactions of interest. For example, if lithography issues are the focus, as discussed in the example below, the snippet dimensions are preferably based on the scope of influence.

Notably, the suspect net 12 may include suspect polygons 14 from a single IC layer, or, as illustrated in FIG. 3, may include suspect polygons 14 from multiple IC layers. In one embodiment, each snippet image depicts suspect polygons 14 or segments of suspect polygons 14 from only a single IC layer. However, the embodiments described herein are not limited to depicting suspect polygons 14 of a single layer, and a snippet image may depict suspect polygons 14 and neighboring polygons 16 from multiple layers.

Figure 4:
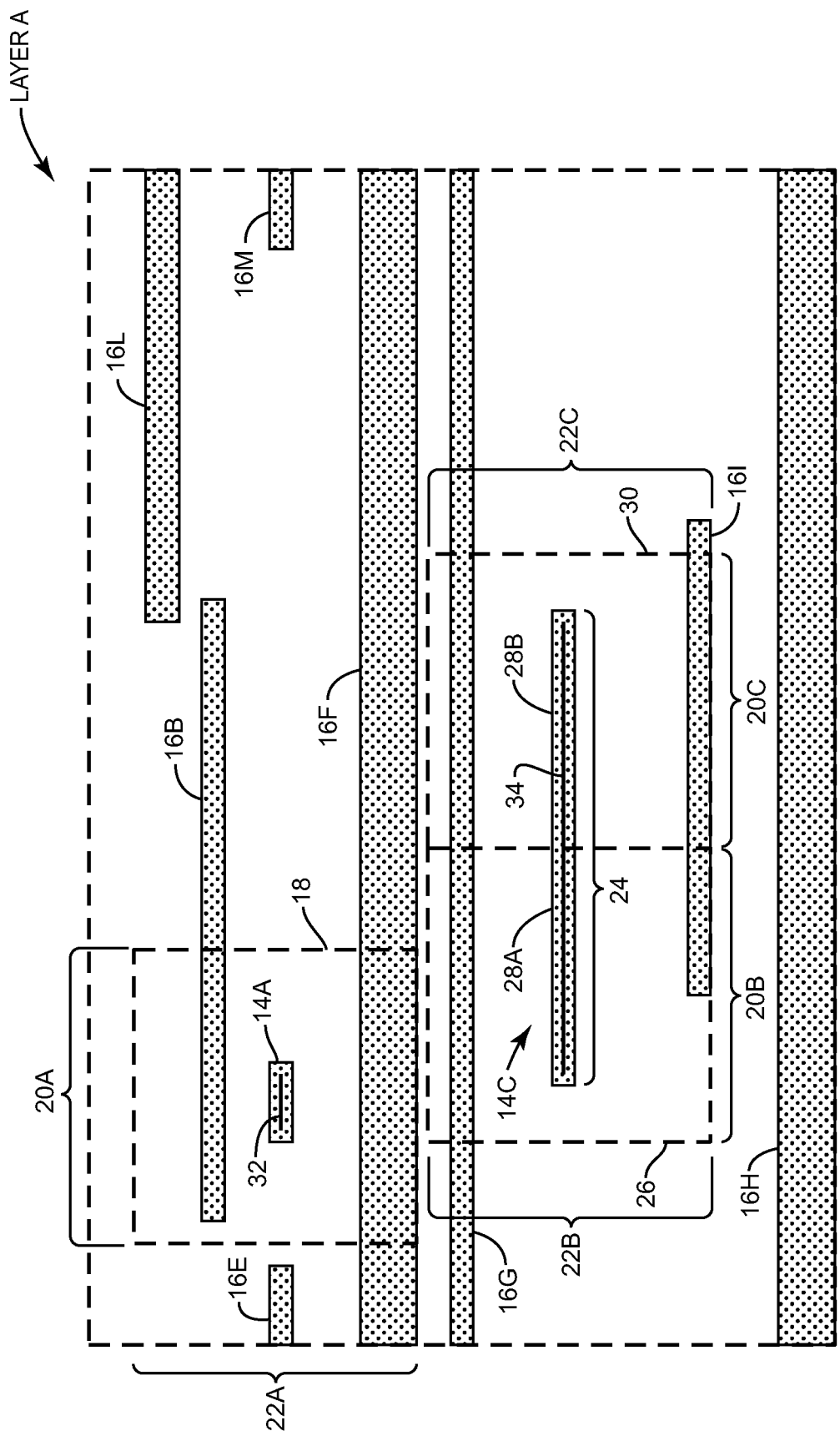
FIG. 4 illustrates the suspect polygons formed in Layer A of the suspect net illustrated in FIG. 3.

Assume for purposes of illustration that it is desired that snippet images depict only those suspect polygons 14 and neighboring polygons 16 that are in the same IC layer. Assume further that the suspect net 12, as illustrated in FIG. 3, includes suspect polygons 14 from two IC layers, a Layer A and a Layer B. FIG. 4 illustrates the suspect polygons 14 formed in Layer A of the suspect net 12. FIG. 4 will be discussed in conjunction with FIG. 2. FIG. 4 also illustrates a snippet frame 18 that depicts the fixed scale and dimensions of a snippet image according to one embodiment. Snippet frames 18 are used herein to illustrate the generation of snippet images. The snippet frame 18 has a width 20A and a height 22A, which in this example are the same, but the embodiments are not limited thereto. A suspect polygon 14 may fit within the dimensions of a snippet image, or a suspect polygon 14 may have a dimension that exceeds the dimensions of a snippet image. For example, the suspect polygon 14A fits within the snippet frame 18, and the suspect polygon 14C has a width 24 (e.g., a length of the long axis of the suspect polygon 14C) that exceeds the width 20B of a snippet frame 26. Where a dimension of a suspect polygon 14 exceeds a dimension of a snippet frame, the suspect polygon 14 is segmented into multiple suspect polygon segments, and a snippet image for each suspect polygon segment is generated.

According to one embodiment, a straight-skeleton algorithm may be used to determine the dimensions of a suspect polygon 14, and to segment and fix the suspect polygon 14 and suspect polygon segments with respect to a reference point of a snippet frame. Straight-skeleton algorithms are available from a variety of sources, and in one embodiment, the Computational Geometry Algorithms Library (CGAL), available from the CGAL Open Source Project, is used. A straight-skeleton of a polygon may be defined as the union of the pieces of angular bisectors traced out by the polygon vertices when the polygon is being shrunk. A straight-skeleton algorithm may provide both contour vertexes and skeleton vertexes of a polygon. The skeleton vertexes may be sufficient for purposes of the embodiments disclosed herein, because skeleton vertexes define the center line of the polygon. Center lines of suspect polygons 14 are illustrated in FIG. 4. In particular, it is determined that the suspect polygon 14A has a center line 32, and the suspect polygon 14C has a center line 34 (FIG. 2, step 2006). The center line of a suspect polygon 14 may be used for centering the polygon within a snippet frame and segmenting the suspect polygon 14 into non-overlapping segments.

If, according to the center line, a suspect polygon 14, such as the suspect polygon 14A, fits within the dimensions of a snippet frame (FIG. 2, step 2008), such as the snippet frame 18, then preferably the snippet frame 18 is positioned about the suspect polygon 14A with respect to a particular reference point of the snippet frame 18 (FIG. 2, step 2010). In the example illustrated in FIG. 4, the particular reference point is the center of the snippet frame 18. Thus, the snippet frame 18 is positioned about the suspect polygon 14A such that the suspect polygon 14A is in the center of the snippet frame 18. Such positioning of suspect polygons 14 with respect to a particular reference point increases the likelihood that snippet images that depict similar layout features will be assigned to the same cluster during the clustering process described herein.

Note that the suspect polygon 14C, however, has a width 24 which exceeds the width 20B of the snippet frame 26, and thus cannot fit within a single snippet frame. In such situations, the suspect polygon 14 is segmented into a sufficient number of segments such that each segment can fit within a snippet frame (FIG. 2, step 2012). In this particular example, the suspect polygon 14C is segmented into two segments 28A, 28B. Each segment 28A, 28B is then centered along at least one dimension of the snippet frame (FIG. 2, step 2014). Thus, the segment 28A is vertically centered in the snippet frame 26, and the polygon segment 28B is vertically centered in a snippet frame 30, but the polygon segments 28A, 28B are preferably not horizontally centered in order to accurately depict that the polygon segments 28A, 28B extend up to an edge of a respective snippet image.

Snippet images are generated based on the snippet frames (FIG. 2, step 2016). This process is repeated for each suspect polygon 14 in the suspect net 12 (FIG. 2, step 2018), for each suspect net 12 in the layout region 10 (FIG. 2, step 2020), for each layout region 10 in each diagnosed IC (FIG. 2, step 2022), and for each diagnosed IC.

Each snippet image may include portions of a suspect polygon 14 as well as neighboring polygons 16. For example, referring to FIG. 4, the snippet image defined by the snippet frame 18 includes the suspect polygon 14 as well as portions of the neighboring polygons 16B and 16F. The snippet image defined by the snippet frame 26 includes the suspect polygon segment 28A as well as portions of the neighboring polygons 16G and 16I. Similarly, the snippet image defined by the snippet frame 30 includes the suspect polygon segment 28B as well as portions of the neighboring polygons 16G and 16I.

Figure 5:
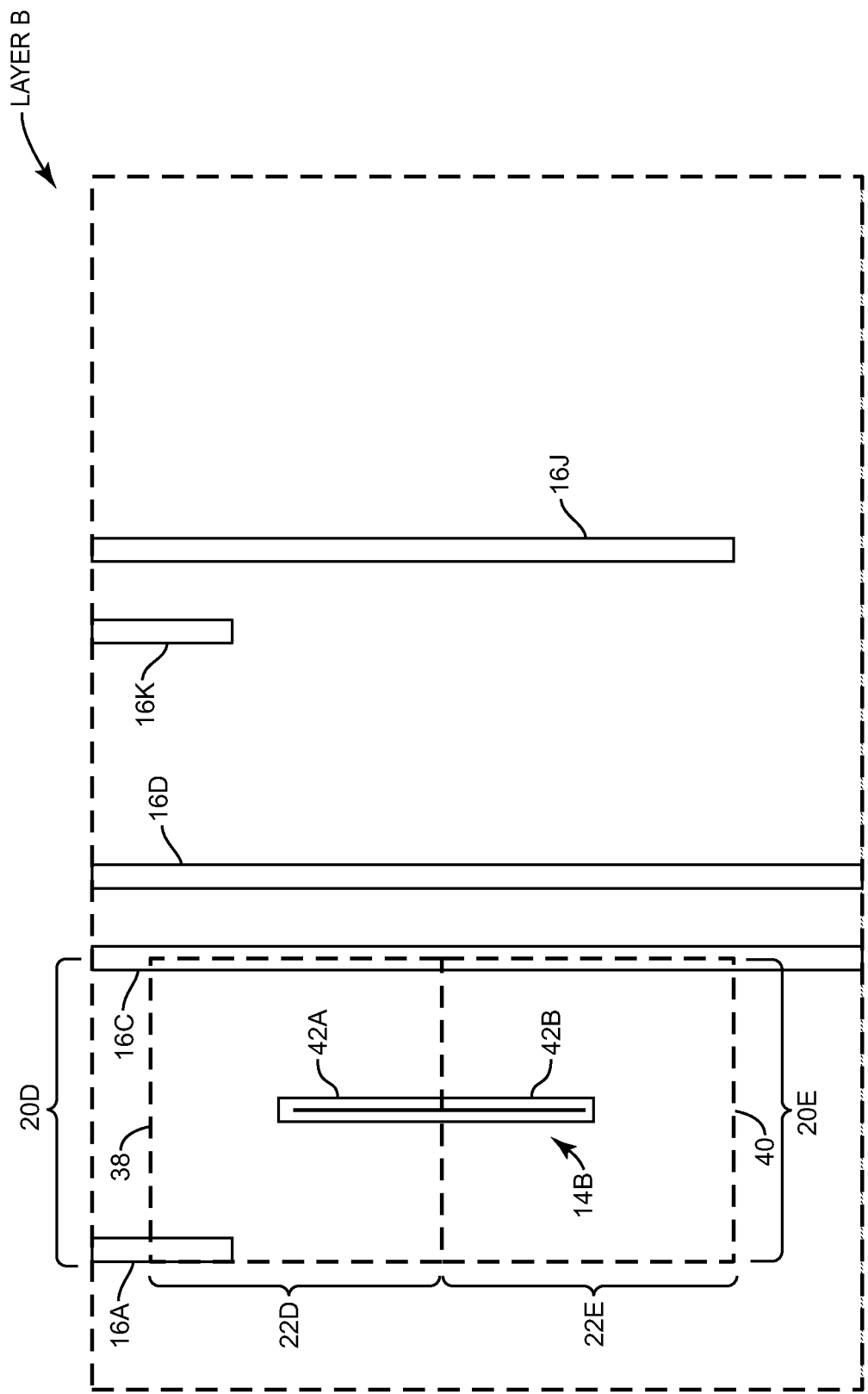
FIG. 5 illustrates the suspect polygons formed in Layer B of the suspect net illustrated in FIG. 3.

FIG. 5 illustrates the suspect polygons 14 formed in Layer B of the suspect net 12. The suspect polygon 14B has a height 36 that exceeds the height 22D of snippet frame 38, and thus is segmented into two snippet frames, the snippet frame 38 and a snippet frame 40. The snippet frame 38 includes a segment 42A of the suspect polygon 14B, as well as portions of the neighboring polygons 16A and 16C. The snippet frame 40 includes a segment 42B of the suspect polygon 14B and a portion of the neighboring polygon 16C.

Figure 6:
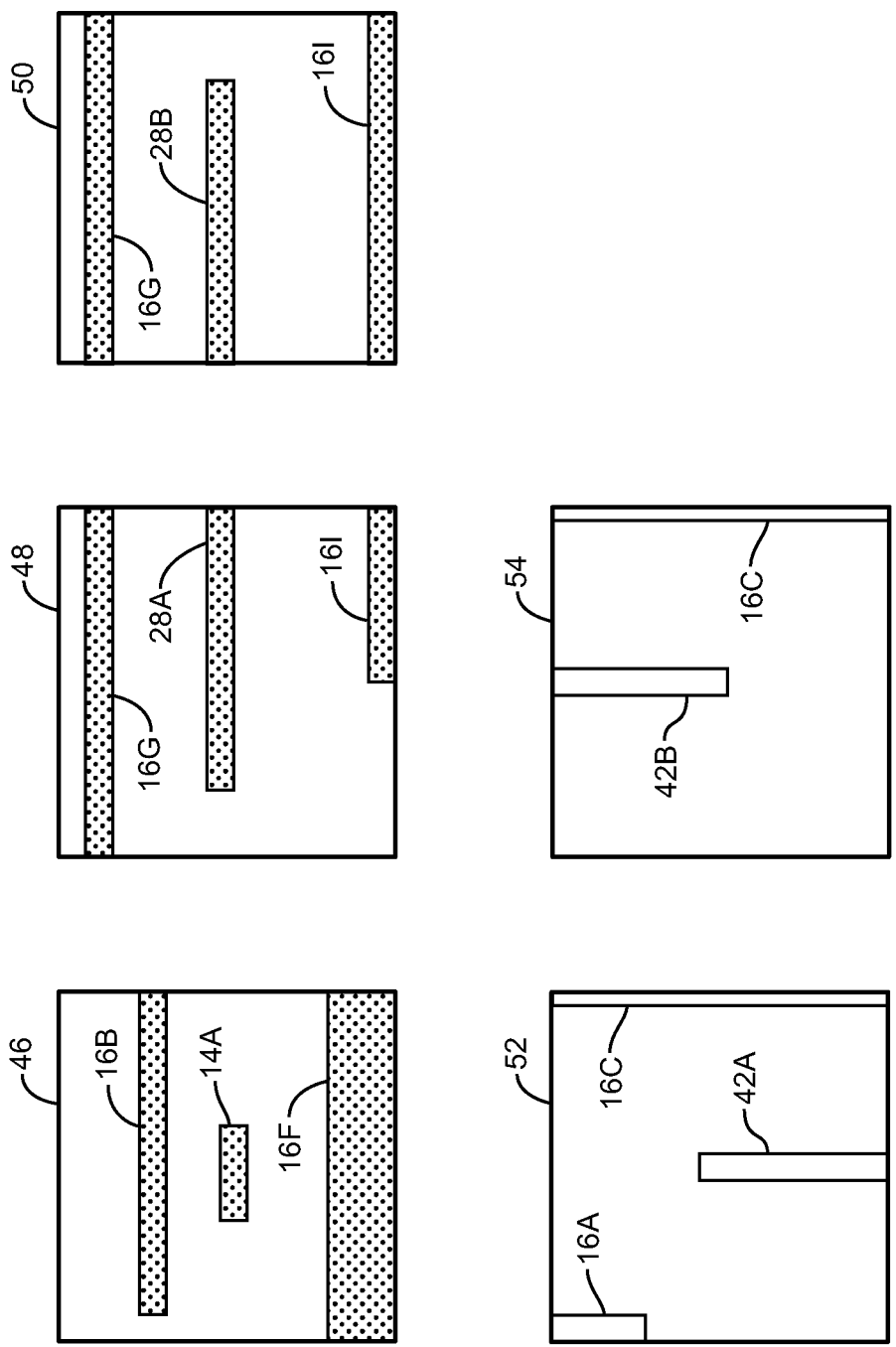
FIG. 6 illustrates snippet images generated based on the snippet frames illustrated in FIGS. 4 and 5.

FIG. 6 illustrates snippet images generated based on the snippet frames 18, 26, 30 (FIG. 4), 38, 40 (FIG. 5). A snippet image 46 is based on the snippet frame 18, a snippet image 48 is based on the snippet frame 26, a snippet image 50 is based on the snippet frame 30, a snippet image 52 is based on the snippet frame 38, and a snippet image 54 is based on the snippet frame 40. For purposes of illustration, the center lines of the suspect polygons 14 depicted in the snippet images are not shown. In one embodiment, the snippet images 46-54 are preferably stored in a graphics format, such as a PDF, PNG, or SVG format.

The process described above is repeated for each suspect net 12 identified in each diagnosed IC, resulting in a plurality of snippet images. The snippet images are then clustered according to a clustering algorithm. Any suitable clustering algorithm, including partitional clustering algorithms and hierarchical clustering algorithms, may be used. However, if the size of the data set of snippet images is substantial, the processing complexity of a hierarchical clustering algorithm may result in excessive processing time. Consequently, the discussion herein will relate to a partitional clustering algorithm, and in particular to a K-means partitional clustering algorithm, although any partitional clustering algorithm may be suitable.

As is known to those skilled in the art, in a K-means clustering algorithm, $x_1, x_2, \ldots, x_N$ denote the N data points (i.e., snippet images) to be clustered; K is the desired number of clusters; $\mu_1, \mu_2, \ldots, \mu_K$ are the cluster centers; and $r_{ij}$ denotes the potential assignment of the i-th data point (i.e., snippet image) to the j-th cluster where $$r_{ij} = \begin{cases} 1 & \text{if the } i\text{-}th \text{ data point is assigned to the } j\text{-}th \text{ cluster} \\ 0 & \text{if otherwise} \end{cases}$$

A K-means clustering algorithm clusters the members of a data set in an effort to minimize the following cost function:

$$C = \sum_{i=1}^{N} \sum_{j=1}^{K} [r_{ij} \times dist(x_i, u_j)]$$

where $dist(x_i, \mu_j)$ is the distance function that measures similarity of a data point (e.g., snippet image) $x_i$ and the cluster center $\mu_j$.

The value for K determines the number of clusters. It is non-trivial to choose an optimal K. Notably, one cannot simply calculate the optimal cost $C_K$ for each K and choose the K that gives the lowest $C_K$, because the optimal $C_K$ is zero when K is chosen to be N (i.e., the number of data points), which corresponds to a scenario where each data point (i.e., snippet image) is a cluster center. In general, K is chosen empirically or by heuristics that penalize data fragmentation. In one embodiment, K is chosen using a relatively simple heuristic:

min K subject to $r_{ij}dist(x_i,\mu_j) < T \; \forall i,j$

In other words, the smallest K such that all the data-point-to-cluster-center distances are smaller than a predefined threshold T (for some 1>T>0) may be chosen. Preferably, as long as each data point (i.e., snippet image) is reasonably close to its cluster center, K is not increased to avoid fragmentation of the snippet images. To improve efficiency, a binary search may be used to search for K. A hard limit may also be used to restrict K to a reasonably small value.

A one-pass approach to clustering the snippet images may be suitable in some embodiments. However, in some embodiments, a one-pass approach may not yield optimal results. In particular, a particularly long suspect net may be segmented into multiple segments which are identical, or substantially identical, thus skewing the results of the clustering algorithm.

Figure 7:
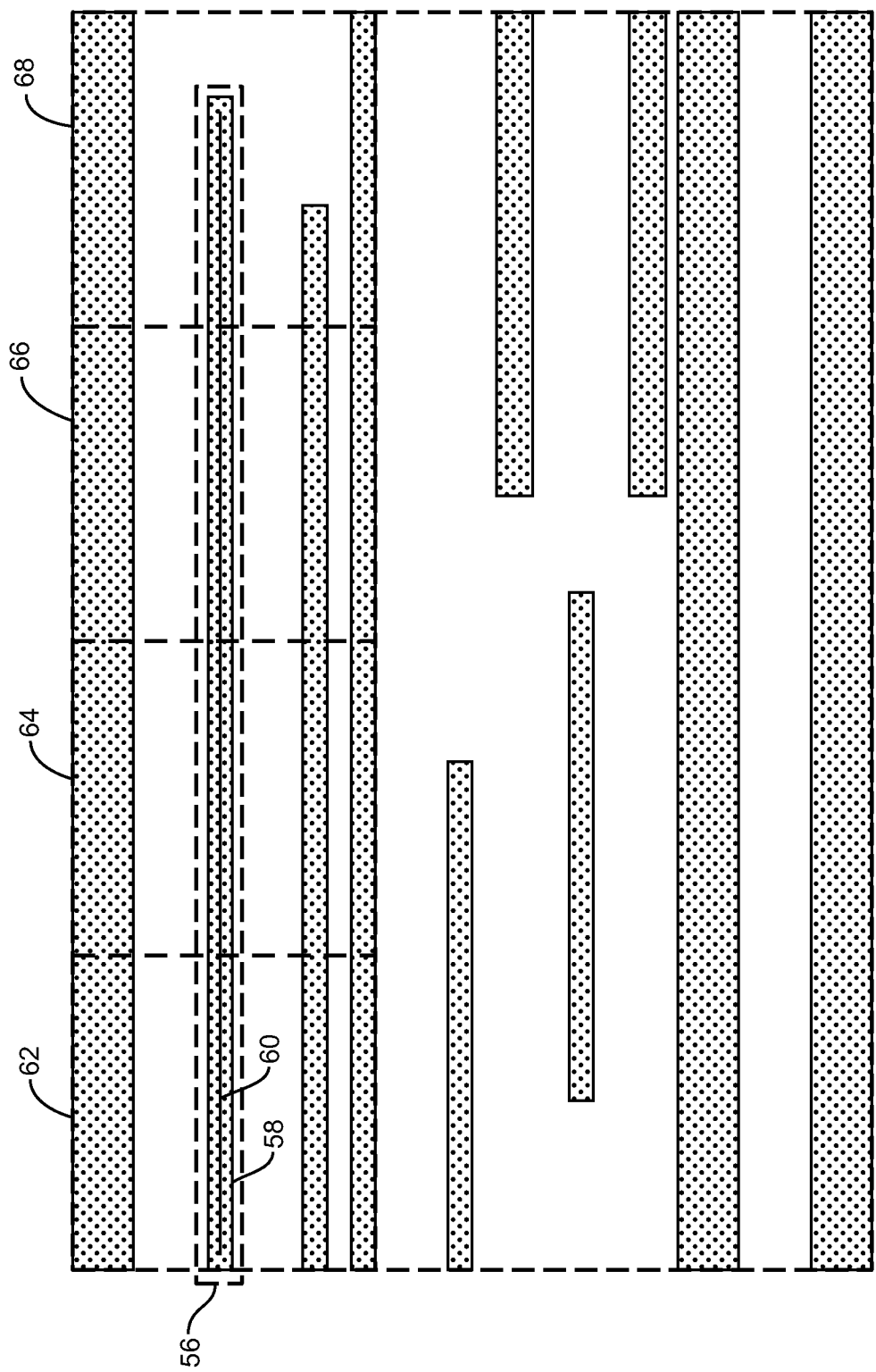
FIG. 7 illustrates an exemplary suspect net containing a long suspect polygon, and a correspondingly long centerline.

FIG. 7 illustrates an exemplary suspect net 56 (identified via a dashed box for purposes of illustration) containing a long suspect polygon 58, and a correspondingly long centerline 60. Snippet frames 62-68 illustrate the snippet images which will be generated based on the scale and dimension of the snippet frames 62-68. Note that the snippet images generated from the snippet frames 62-66 are identical because of the geometry of the suspect polygon 58 and its neighboring polygons. Similar or identical snippet images will likely skew the center of a cluster toward such identical images. This may not be desirable, since such snippet images essentially depict the same feature of the same suspect net 56. Accordingly, in one embodiment, a two-pass clustering process is used.

Figure 8:
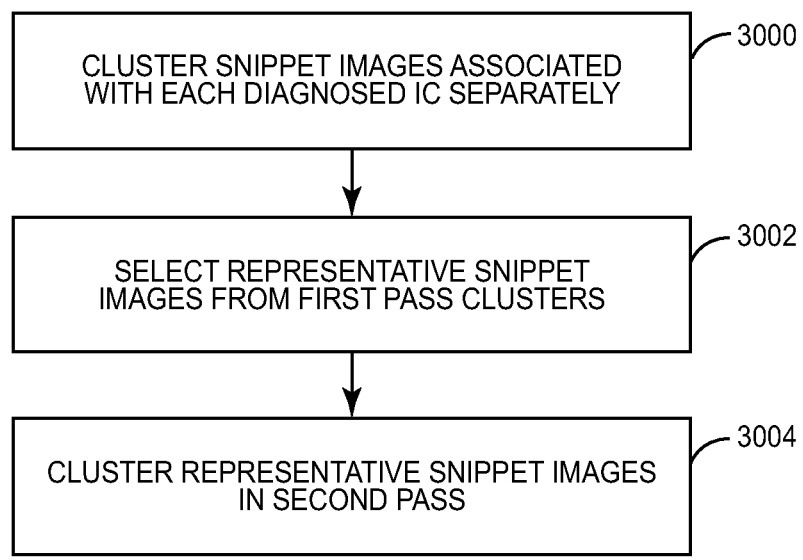
FIG. 8 is an exemplary flowchart illustrating a two-pass clustering process according to one embodiment.

FIG. 8 is an exemplary flowchart illustrating a two-pass clustering process according to one embodiment. In the first pass, the snippet images that are generated based on a particular diagnosed IC are clustered separately from those generated based on other diagnosed ICs (step 3000). In other words, the snippet images from each diagnosed IC are clustered separately. For example, if a first diagnosed IC resulted in 110 snippet images, and a second diagnosed IC resulted in 73 snippet images, the 110 snippet images would be clustered separately from the 73 snippet images. Snippet images from the resulting clusters are then selected and designated as representative snippet images for the second pass (step 3002). For example, referring again to FIG. 7, because the snippet images generated from snippet frames 62-66 would likely end up in the same cluster after the first pass, only one of such snippet images may be selected as a representative snippet image for the second pass. After selection of all the representative snippet images, such representative snippet images are then, as a group, clustered into clusters in the second pass (step 3004). In another embodiment, the first pass may distinguish between suspect nets, but not between diagnosed ICs. In other words, the snippet images associated with each suspect net, whether from the same diagnosed IC or not, may be separately clustered.

Figure 9:
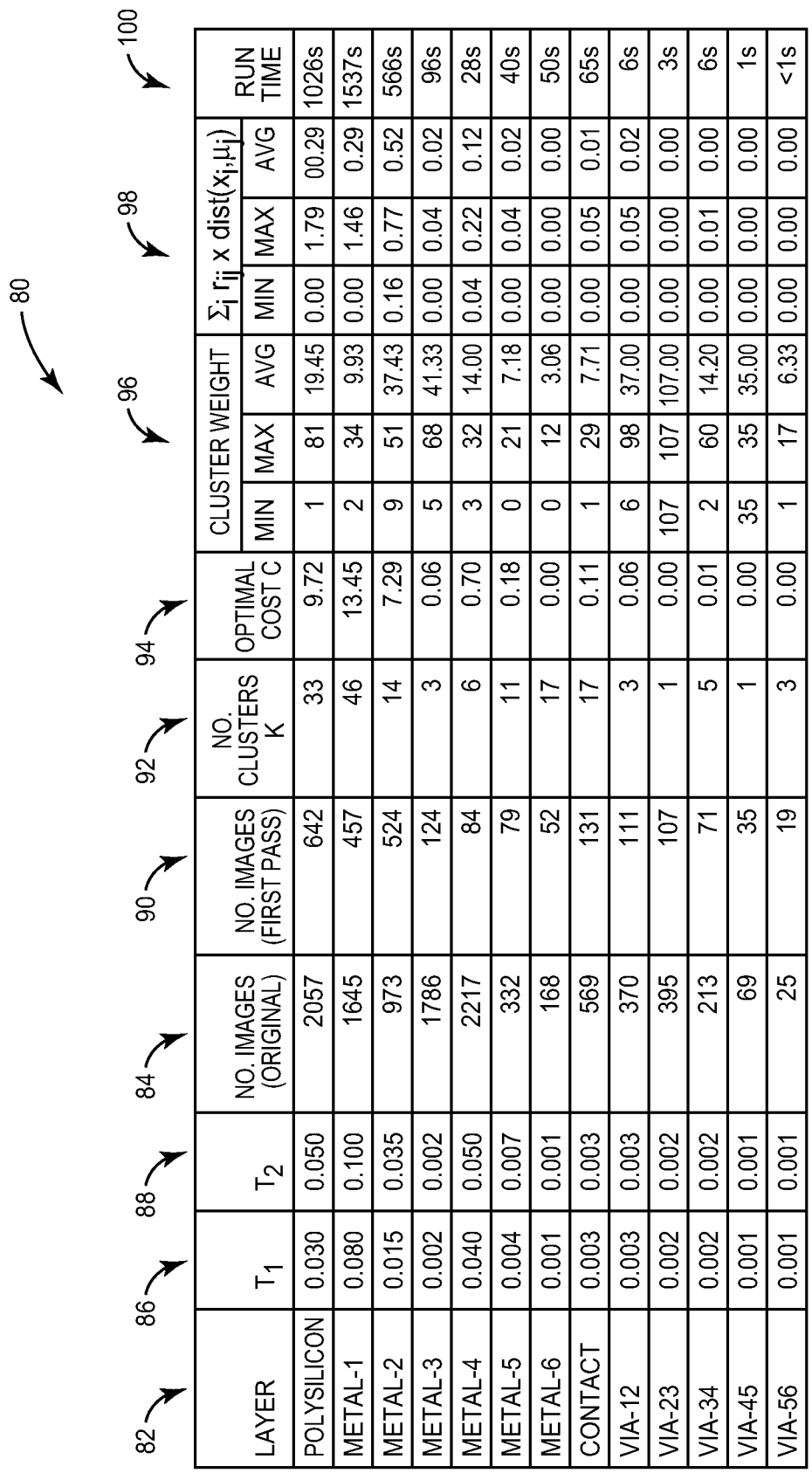
FIG. 9 is a table illustrating results after a two-pass clustering process according to one embodiment.

FIG. 9 is a table 80 illustrating results after a two-pass K-means clustering process according to one embodiment. In this example, 738 defective ICs were initially diagnosed. Each IC was fabricated using 130 nm technology from an IC layout of interest, and included 384 64-bit arithmetic logic units (ALUs). Each ALU had approximately 3000 gates, and was tested within a full-scan environment for approximately 100% stuck-at fault coverage with approximately 230 tests, although it is noted that the number of tests may vary for each ALU.

2,168 suspect nets were identified from the diagnosis of the 738 defective ICs. Of the 738 defective ICs, a group of 106 ICs resulted in the selection of a single suspect net, while the remainder of the 738 defective ICs (i.e., 632 ICs) resulted in the selection of multiple suspect nets. In this example, only the suspect nets selected from the group of 106 ICs were used for the subsequent steps, since the identification of a single suspect net may indicate more certainty as to the cause of the defect in the respective IC. Two additional ICs with pre-existing physical failure analysis (PFA) results were included.

Defective nets identified during the PFA were included. The defective nets from the two additional ICs were different from all the suspect nets identified in the group of 106 ICs. The defective nets from the two additional ICs which underwent PFA will be referred to herein as "known defective nets" to distinguish such nets from the suspect nets identified in the group of 106 ICs.

A snippet frame having a dimension of 2 µm by 2 µm was used. In this example, such a snippet frame size results in a width and height which are more than 15 times larger than the minimum feature size (i.e., 0.13 μm) and therefore should be sufficient for capturing all optical interactions for capturing each center line in each suspect polygon. In an effort to minimize excessive clustering processing time, the selected snippet image resolution was 100 by 100 pixels. The selection of a particular image resolution may be determined empirically. A higher resolution results in greater accuracy, but a slower run time. A total of 10,819 snippet images were generated from the suspect nets and known defective nets. Referring to the table 80, column 82, labeled "Layer," identifies the different layers of the IC layout of interest for which snippet images were generated. In this embodiment, lithography issues were a focus, and thus the snippet images were clustered on a layer-by-layer basis because lithography issues are typically a function of a single layer only. However, as noted above, it is not generally necessary to cluster the snippet images on a layer-by-layer basis. Column 84, labeled "No. Images (original)," identifies the number of snippet images generated for each layer of the IC layout of interest.

Column 86, labeled "$T_1$," identifies the value of T for the first pass of the K-means clustering process. As discussed above, T is the smallest K such that all the data-point-to-cluster-center distances are smaller than the predefined threshold T. T is typically determined empirically. Column 88, labeled "$T_2$," identifies the value of T for the second pass of the K-means clustering process. Column 90, labeled "No. Images (first pass)," identifies the number of images selected for the second pass of the two-pass K-means clustering process. Column 92, labeled "No. Clusters K," identifies the number of clusters formed for each particular layer after the second pass. Column 94, labeled "Optimal Cost C," identifies the resulting cost C. Column 96, labeled "Cluster Weight," includes three sub-columns labeled "min," "max," and "avg," which identify the minimum, maximum, and average weights, respectively (e.g., number of snippet images in a cluster) for the clusters associated with each respective layer. Cluster weight the column 96) is a measure of the importance of a cluster. For example, a cluster with a weight of 20 is not as important as a cluster with a weight of 100. Column 98, labeled "$\Sigma_i r_{ij} \times dist(x_i, \mu_j)$," includes three sub-columns labeled "min," "max," and "avg," which identify the minimum, maximum, and average values, respectively, of the summation of the snippet-image-to-cluster-center distances $\Sigma_i r_{ij} \times dist(x_i, \mu_j)$. The column 98 identifies the distance size of a cluster. Column 100 identifies the run time of the clustering process for the first and second passes of the two-pass K-means clustering process, executed on a computing device with a 2.8 GHz processor and having 16 GB of random access memory.

Notably, the snippet images which depicted the respective defect in each of the two defective ICs were clustered in large clusters. A first defect diagnosed in the defective ICs was a bridge between a polysilicon gate and its active region. The snippet image corresponding to this defect was assigned to the third largest cluster in the polysilicon layer. A second defect diagnosed in the defective ICs was a bridge between two nets in the "METAL-2" layer. The snippet image corresponding to this defect was assigned to a cluster with a weight of 29.

Figure 10:
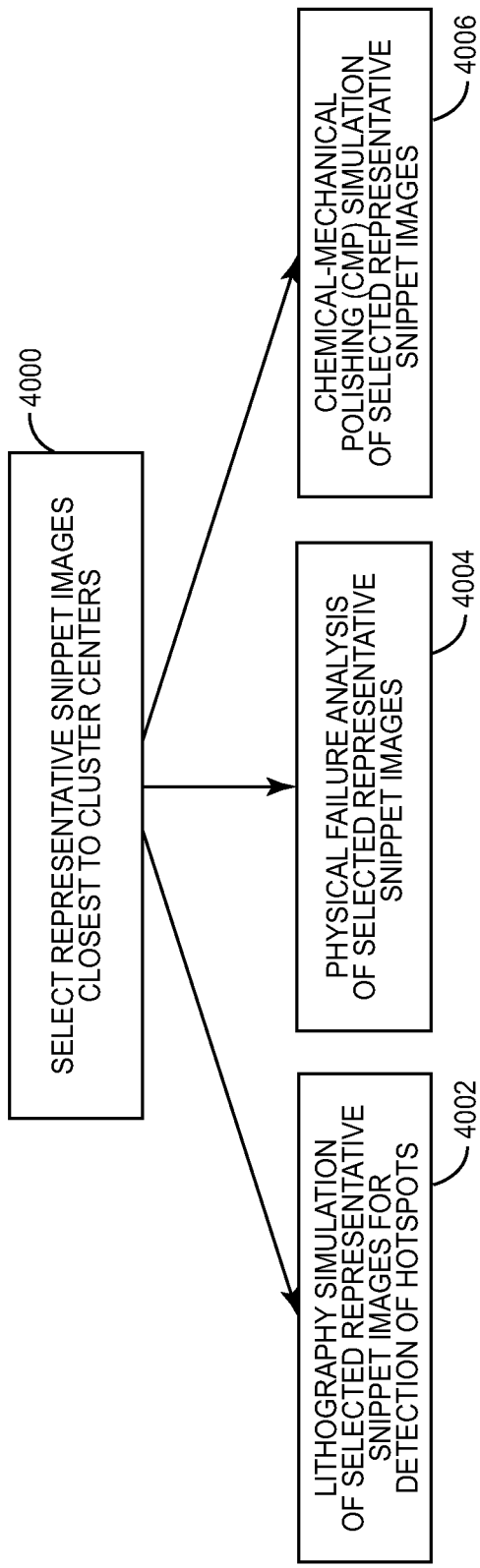
FIG. 10 is an exemplary flowchart illustrating a process for selecting representative snippet images and further analyzing such snippet images according to one embodiment.

After the snippet images are clustered, representative snippet images from various clusters may be chosen for subsequent analysis. FIG. 10 is an exemplary flowchart illustrating a process for selecting representative snippet images and further analyzing such snippet images according to one embodiment. First, one or more representative snippet images are selected from one or more clusters (step 4000). Preferably, snippet images from larger clusters are selected, and snippet images closest to a center of a cluster are selected. Next, such snippet images may undergo any of a number of different validation or analysis methodologies. For example, snippet images may undergo lithography simulation for hotspot analysis (step 4002). In one embodiment, the Optissimo simulator available from PDF Solutions, 333 W. San Carlos Street, Suite 700, San Jose, Calif., is used, however, the embodiments described herein may use any suitable lithography simulator. The representative snippet images alternately or in addition may undergo PFA (step 4004). The representative snippet images alternately, or in addition, may undergo chemical-mechanical polishing (CMP) simulation (step 4006).

Figure 11:
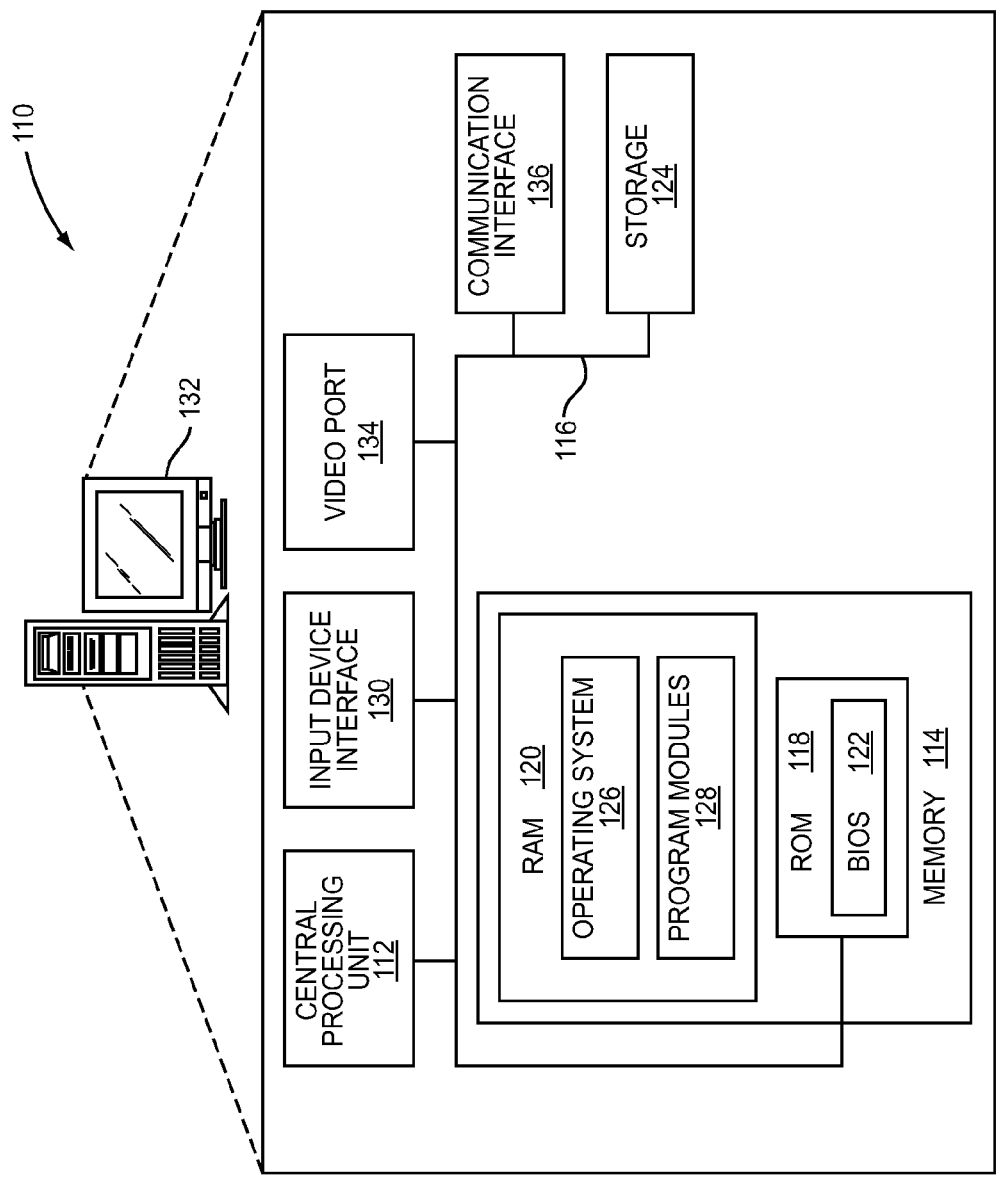
FIG. 11 is a block diagram of an exemplary computing device which may be used to implement some or all of the embodiments discussed herein.

FIG. 11 is a block diagram of an exemplary computing device which may be used to implement some or all of the functionality discussed herein. The computing device 110 may comprise, for example, a laptop computer, a desktop computer, a workstation, a proprietary mainframe computer, or the like. The computing device 110 may include a central processing unit 112, a system memory 114, and a system bus 116. The system bus 116 provides an interface for system components including, but not limited to, the system memory 114 and the central processing unit 112. The central processing unit 112 can be any of various commercially available or proprietary processors. Dual microprocessors and other multi-processor architectures may also be employed as the central processing unit 112.

The system bus 116 may be any of several types of bus structures that may further interconnect to a memory bus (with or without a memory controller), a peripheral bus, and/or a local bus using any of a variety of commercially available bus architectures. The system memory 114 may include non-volatile memory 118 (e.g., read only memory (ROM), erasable programmable read only memory (EPROM), electrically erasable programmable read only memory (EEPROM), etc.) and/or volatile memory 120 (e.g., random access memory (RAM)). A basic input/output system (BIOS) 122 may be stored in the non-volatile memory 118, and can include the basic routines that help to transfer information between elements within the computing device 110. The volatile memory 120 may also include a high-speed RAM such as static RAM for caching data.

The computing device 110 may further include a computer-readable storage 124, which may comprise, for example, an internal hard disk drive (HDD) (e.g., enhanced integrated drive electronics (EIDE) or serial advanced technology attachment (SATA)) for storage, flash memory, or the like. The IC layout, OA database, and snippet images, for example, may be stored in the computer-readable storage 124. The drives and associated computer-readable and computer-usable media provide non-volatile storage of data, data structures, computer-executable instructions, and so forth. For the computing device 110, the drives and media accommodate the storage of any data in a suitable digital format. Although the description of computer-readable storage above refers to an HDD, it should be appreciated by those skilled in the art that other types of media which are readable by a computer, such as Zip disks, magnetic cassettes, flash memory cards, cartridges, and the like, may also be used in the exemplary operating environment, and further, that any such media may contain computer-executable instructions for performing novel methods of the disclosed architecture.

A number of program modules can be stored in the computer-readable storage 124 and in the volatile memory 120, including an operating system 126 and one or more program modules 128, which may implement the functionality described herein in whole or in part, including, for example, functionality associated with diagnosing a defective IC, extracting snippet regions, generating snippet images, clustering snippet images, further validation and analysis of representative snippet images, and other processing and functionality described herein. It is to be appreciated that the embodiments can be implemented with various commercially available operating systems 126 or combinations of operating systems 126.

All or a portion of the embodiments may be implemented as a computer program product, such as a computer-usable or computer-readable medium having a computer-readable program code embodied therein. Such computer-usable or computer-readable medium can comprise, for example, a hard drive, a flash drive, a DVD disk, or any other non-transient media. The computer-readable program code can include software instructions for implementing the functionality of the embodiments described herein. The central processing unit 112, in conjunction with the program modules 128 in the volatile memory 120, may serve as a control system for the computing device 110 that is configured to, or adapted to, implement the functionality described herein.

A user may be able to enter commands and information into the computing device 110 through one or more input devices, such as, for example, a touch sensitive display (not illustrated); a keyboard (not illustrated); or a pointing device, such as a mouse (not illustrated). Other input devices (not illustrated) may include a microphone, an infrared (IR) remote control, a joystick, a game pad, a stylus pen, or the like. These and other input devices are often connected to the central processing unit 112 through an input device interface 130 that is coupled to the system bus 116, but can be connected by other interfaces such as a parallel port, an IEEE 1394 serial port, a universal serial bus (USB) port, an IR interface, etc.

The computing device 110 may drive a separate or integral display 132, which may also be connected to the system bus 116 via an interface, such as a video port 134. The computing device 110 may include a communication interface 136 for communicating with a wired or wireless LAN or wireless personal area network technology, including, for example, Wi-Fi®, Bluetooth®, or ZigBee®.

Those skilled in the art will recognize improvements and modifications to the preferred embodiments of the present disclosure. All such improvements and modifications are considered within the scope of the concepts disclosed herein and the claims that follow.

What is claimed is:

1. A method for identifying a suspect layout feature from a plurality of layout features contained in an integrated circuit (IC) layout, comprising:
    generating a plurality of snippet images depicting suspect polygons, each of the snippet images depicting at least a portion of a suspect polygon which is different from a portion of the suspect polygon depicted in others of the plurality of snippet images, the suspect polygons being determined based on the diagnosis of a plurality of defective ICs manufactured according to the IC layout; and
    assigning each of the plurality of snippet images to a particular cluster of a plurality of clusters based on similarities between snippet images in each respective cluster.

2. The method of claim 1, further comprising:
    identifying a plurality of suspect nets from the plurality of defective ICs, wherein each of the suspect polygons is contained in at least one of the plurality of suspect nets.

3. The method of claim 2, wherein assigning each of the plurality of snippet images to the particular cluster of the plurality of clusters based on the similarities between the snippet images in the each respective cluster further comprises:
    in a first pass, for each suspect net of the plurality of suspect nets, assigning each of the plurality of snippet images that depicts at least a portion of a suspect polygon from the each suspect net to one of a plurality of first clusters;
    selecting a plurality of representative snippet images from ones of the plurality of first clusters; and
    in a second pass, assigning each of the plurality of representative snippet images to the particular cluster of the plurality of clusters based on similarities between the representative snippet images in each respective cluster.

4. The method of claim 3, wherein selecting the representative snippet images from the ones of the plurality of first clusters comprises selecting the representative snippet images from the ones of the plurality of first clusters such that no two snippet images from a same first cluster are selected as representative snippet images.

5. The method of claim 2, wherein assigning each of the plurality of snippet images to the particular cluster of the plurality of clusters based on the similarities between the snippet images in the each respective cluster further comprises:
    in a first pass, for each defective IC of the plurality of defective ICs, assigning each of a plurality of snippet images generated based on a diagnosis of the each defective IC to one of a plurality of first clusters;
    selecting a plurality of representative snippet images from ones of the plurality of first clusters; and
    in a second pass, assigning each of the plurality of representative snippet images to the particular cluster of the plurality of clusters based on similarities between the representative snippet images in the each respective cluster.

6. A method for identifying suspect layout features from a plurality of layout features of an integrated circuit (IC) layout, comprising:
    generating a plurality of snippet images, each of the snippet images depicting at least a portion of a suspect layout feature which is different from suspect layout features depicted in others of the plurality of snippet images, the suspect layout features being determined based on the diagnosis of a plurality of defective ICs manufactured in accordance with the IC layout; and
    generating a plurality of clusters, each of the clusters containing a group of the plurality of snippet images based on similarities between the snippet images.

7. The method of claim 6, further comprising:
    identifying a primary cluster from the plurality of clusters having a largest group of the plurality of snippet images; and
    identifying a subset of snippet images from the primary cluster closest to a center of the primary cluster.

8. The method of claim 7, further comprising:
    performing a hotspot analysis on the subset of snippet images to determine if any of the snippet images in the subset of snippet images contains a hotspot.

9. The method of claim 8, wherein the hotspot analysis is performed by a lithography simulation module.

10. The method of claim 6, wherein each of the suspect layout features comprises at least a portion of a suspect polygon.

11. The method of claim 10, wherein the portion of the suspect polygon depicted in each of the plurality of snippet images is positioned in the respective snippet image with respect to a same reference location.

12. The method of claim 11, wherein the same reference location is a center of the respective snippet image.

13. The method of claim 6, wherein each of the plurality of snippet images has the same dimensions and the same scale.

14. The method of claim 6, wherein at least some of the plurality of snippet images further depict a second layout feature in addition to the at least the portion of the suspect layout feature.

15. A computing device comprising:
- a communications interface adapted to communicate with a network; and
- a control system comprising a processor and coupled to the communications interface, the control system adapted to:
  - generate a plurality of snippet images, each of the snippet images depicting at least a portion of a suspect layout feature which is different from suspect layout features depicted in others of the plurality of snippet images, the suspect layout features being determined based on diagnoses of a plurality of defective integrated circuits manufactured in accordance with an integrated circuit (IC) layout; and
  - generate a plurality of clusters, each of the clusters containing a group of the plurality of snippet images based on similarities between the plurality of snippet images.

16. The computing device of claim 15, wherein the control system is further adapted to:
- identify a primary cluster from the plurality of clusters having a largest group of the plurality of snippet images; and
- identify a subset of snippet images from the primary cluster closest to a center of the primary cluster.

17. The computing device of claim 16, wherein the control system is further adapted to:
- perform a hotspot analysis on the subset of snippet images to determine if any of the snippet images in the subset of snippet images contains a hotspot.

18. The computing device of claim 15, wherein each of the suspect layout features comprises at least a portion of a suspect polygon.

19. The computing device of claim 18, wherein the portion of the suspect polygon depicted in each of the plurality of snippet images is positioned in the respective snippet image with respect to a same reference location.

20. The computing device of claim 15, wherein at least some of the plurality of snippet images further depict a second layout feature in addition to the at least the portion of the suspect layout feature.

\* \* \* \* \*

UNITED STATES PATENT AND TRADEMARK OFFICE
CERTIFICATE OF CORRECTION

PATENT NO. : 8,509,517 B2  
APPLICATION NO. : 12/980703  
DATED : August 13, 2013  
INVENTOR(S) : Blanton et al.

Page 1 of 1

It is certified that error appears in the above-identified patent and that said Letters Patent is hereby corrected as shown below:

On the Title Page, please add the following Related U.S. Application Data:

-- Provisional application No. 61/397,605 filed Jun. 14, 2010 --.

Signed and Sealed this  
Fifteenth Day of October, 2013

Teresa Stanek Rea  
*Deputy Director of the United States Patent and Trademark Office*